United States Patent [19]

Fletcher et al.

[11] 4,033,882
[45] July 5, 1977

[54] WIDEBAND HETERODYNE RECEIVER FOR LASER COMMUNICATION SYSTEM

[76] Inventors: James C. Fletcher, Administrator of the National Aeronautics and Space Administration, with respect to an invention of Theodore Flattau, Dix Hills, N.Y.; Ronald Albert Lange, Huntington, N.Y.; John Walter Mellars, Westbury, N.Y.; Bernard Joseph Peyton, Huntington Station, N.Y.; John Martin Wolczok, Farmingdale, N.Y.

[22] Filed: Mar. 18, 1976

[21] Appl. No.: 667,930

[52] U.S. Cl. .................................. 250/199; 250/238
[51] Int. Cl.² ........................................ H03D 1/24
[58] Field of Search ............................ 250/199, 238

[56] References Cited
UNITED STATES PATENTS

| | | |
|---|---|---|
| 3,258,602 | 6/1966 | Promish .............................. 250/238 |
| 3,407,322 | 10/1968 | Saum .................. 250/238 |
| 3,975,628 | 8/1976 | Graves .................. 250/199 |

*Primary Examiner*—Richard Murray
*Attorney, Agent, or Firm*—Robert D. Marchant, John O. Tresansky
John R. Manning

[57] ABSTRACT

A wideband heterodyne receiver for a laser communication system is disclosed which includes a front end having a cooled photomixer contained in a hermetically sealed spaced quality housing designed for wide bandwidth transmission. The photomixer is coupled through a wideband preamplifier to the receiver back end which includes a frequency tracking network and demodulating equipment. The receiver is capable of tracking a doppler frequency shift of 750 MHz, positive or negative, and has an instantaneous intermediate frequency information bandwidth of 400 MHz. The receiver system is also capable of operating over a wide temperature range and is designed to be suitable for use in outer space communication.

9 Claims, 5 Drawing Figures

WIDEBAND HETERODYNE RECEIVER FOR LASER COMMUNICATION SYSTEM

ORIGIN OF THE INVENTION

The invention described herein was made in the performance of work under a NASA contract and is subject to the provision of Section 305 of the National Aeronautics and Space Act of 1958, Public Law 85-568 (72 stat. 435; USC 2457).

BACKGROUND OF THE INVENTION

1. Field of the Invention

The present invention relates generally to laser communication receivers, and more particularly to a wideband heterodyne receiver for a laser communication system.

2. Background of the Invention

Considerable interest exists in laser communication links as they provide an efficient, wide bandwidth, relatively noise immune technique of transmitting information, particularly in open environments such as outer space. Specific situations in which laser communication links would be most beneficial are in satellite to earth station communications and satellite to satellite communications. In particular, a number of advantages, clearly apparent to those skilled in the art, would be derived from a system which would permit interference free communication between a synchronous satellite and a low altitude satellite and also between the low altitude satellite and a ground station. The most serious problem in the development of such a communication system is in the high relative velocities between the various stations involved resulting in a large, time varying doppler frequency shift in the communication system.

In a laser communication system, such a time varying doppler frequency shift must be frequency tracked by either a spectrally a wide laser local oscillator which can be rapidly tuned at infrared wavelengths, or by a heterodyne receiver which employs a fixed frequency laser local oscillator and a wideband intermediate frequency network which can be rapidly scanned using radio frequency techniques.

The latter technique has been used in constructing a heterodyne laser communications receiver in accordance with the teachings of the present invention, as will be set forth in more detail subsequently.

Other optical heterodyne communication receivers are known to those skilled in the art as evidenced by U.S. Pat. No. 3,530,289 to Hubbard, et al, issued Sept. 22, 1970. However, while the system disclosed in the Hubbard et al patent includes a wideband optical heterodyne receiver with appropriate pulse processing circuitry, it does not incorporate any doppler frequency shift circuitry, appropriate photomixers and other signal processing components which would render it suitable for use in satellite-to-satellite or satellite-to-ground communications of the type briefly described above. Accordingly there is a need for an improved laser communication receiver which is capable of compensating for large doppler frequency shifts in an environment where a large relative velocity exists between transmitting and receiving stations.

SUMMARY OF THE INVENTION

Accordingly, one object of this invention is to provide a novel receiver for a laser communication system.

Another object of the present invention is the provision of a novel wideband heterodyne receiver for use in a laser communication system.

A still further object of the present invention is the provision of a novel laser communication receiver which tracks doppler frequency shifts whereby communications between a transmitting station and a receiving station in relative motion may be carried out without distortion.

Yet another object of the present invention is the provision of a novel laser communication receiver having a wide bandwidth front-end portion capable of reliable operation over a wide temperature range.

A still further object of the present invention is the provision of a novel wide bandwidth heterodyne laser communication receiver having a wide bandwidth front-end portion and a doppler frequency tracking and signal demodulating back-end portion.

Briefly, these and other objects of the present invention are achieved by the provision of a heterodyne laser communication receiver including a cooled, wideband photomixer for sensing incoming optical data signals and having a wideband preamplifier coupled thereto. A signal processing network is coupled to the preamplifier and includes a signal tracking network for following the doppler frequency shift and received signals. A demodulating network is coupled to the output of the frequency following network for demodulating received information.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
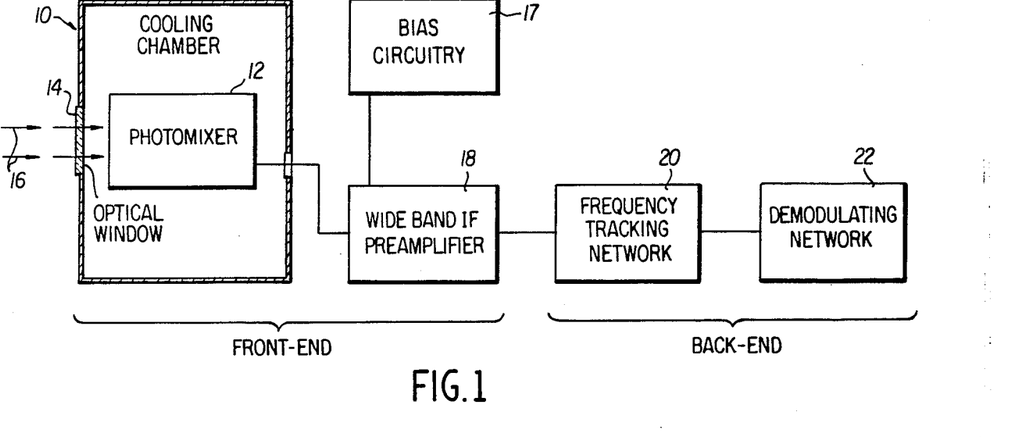
FIG. 1 is a simplified block diagram showing the major functional components of the system of the present invention.

Referring now to the drawings, wherein like reference numerals designate identical or corresponding parts throughout the several views, and more particularly to FIG. 1 thereof, an evacuated cooling chamber 10 is illustrated housing a photomixer 12. The cooling chamber 10 includes an optically transparent window 14 for permitting impinging optical signals, represented by arrows 16, to penetrate the walls of the cooling chamber and impinge upon the photomixer 12. It is noted that suitable biasing circuitry 17 is coupled to the photomixer 12 for providing the required input power.

The output of the photomixer 12 is amplified by a wideband intermediate frequency preamplifier 18 which is selected to have a sufficient bandwidth to pass without distortion signals having the maximum amount of doppler shift for the selected use environment of the system (in the present instance a doppler shift of plus or minus 750 MHz is assumed). The output of the preamplifier 18 is passed to a frequency tracking network 20 which converts the wideband output of the preamplifier 18 to a relatively narrow band signal for improved noise rejection and signal quality enhancement. The tracked frequency output of the network 20 is applied to a demodulating network 22 wherein the information content is separated from the carrier components of the input signal.

In the circuit diagram of FIG. 1, the photomixer 12 and its associated cooling and biasing apparatus along with the wideband intermediate frequency (IF) preamplifier 18 is considered to the front-end or signal receiving end of the disclosed communication receiver. Similarly, the frequency tracking and demodulating networks 20 and 22 are considered to be the back-end or main signal processing electronics of the system.

The receiver system of the present invention is intended to be used with conventional $CO_2$ lasers operating at a wavelength of approximately 10.6 um in the infrared region. The basis operation of heterodyne laser communication systems is well known and has been described in IEEE Journal of Quantum Electronics, Volume QE-8, No. 2, Feb. 1972, Pages 252–263. This publication in particular describes the manner in which a laser local oscillator is used in combination with the signal from a distant transmitter to produce a heterodyne system and also describes the basic properties of photomixers of the type used in the present system. Specifically, the reference publication describes the properties of both photovoltaic (PV) and photoconductive (PC) HgCdTe infrared mixer elements. Thus the general characteristics of such elements are considered to be well known and accordingly there is no need to repeat such information in the present specification. The present specification will accordingly be limited to a description of the unique manner in which the photomixer is housed in the environment of the present invention and also to the signal processing electronics used in the novel heterodyne receiver of the present invention.

Figure 2:
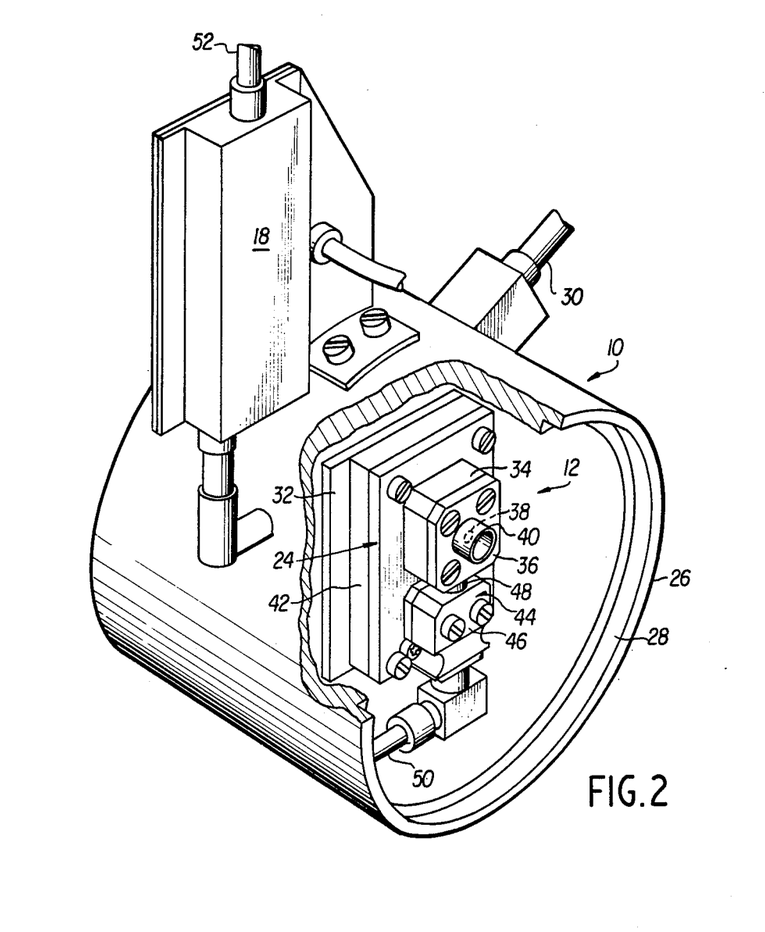
FIG. 2 is an end view of the photomixer cooler assembly illustrating the position and configuration of the photomixer housing and intermediate frequency preamplifier.

Referring now to FIG. 2, the mechanical structure of the cooling chamber 10 is shown wth a photomixer housing 24 mounted within it. The cooling chamber 10 is basically of conventional design and is illustrated in the form of a laboratory research tool rather than a final housing for use in outer space. Nevertheless, it will be appreciated that suitable outer space housings are well within ordinary skill in the art, and do not constitute a specific aspect of the present invention. The illustrated cooling chamber consists of a cylindrically shaped vacuum shroud 26 which is normally fully enclosed by a disc-like cover portion (not shown) which provides a vacuum tight seal with a front surface 28 of the vacuum shoud 26. The cover portion includes an optical window to permit laser signals to fall upon the photomixer position within the vacuum shroud 26. The vacuum shroud 26 is coupled through an evacuation valve 30 to a conventional vacuum system (not shown) which maintains the pressure within the vacuum shroud at $10^{-4}$ torr, or less, in order to permit cryogenic temperatures to be maintained within the shroud. In practice, a radiation shield may be positioned around the vacuum shroud 26 to reduce heat loss by radiation through the walls of the vacuum shroud.

A cooling apparatus for providing cryogenic temperatures is coupled to the cooling chamber, and includes a cryogenic temperature tip or mounting surface 32 within the vacuum shroud 26 upon which the photomixer housing 24 is mounted. When the system is used in outer space operations, the cooling apparatus for the cryogenic mounting surface 32 may simply be a conventional radiation cooler. In laboratory environments, however, a more sophisticated arrangement is necessary, such as an open-cycle Joule-Tomson cryo-tip AC-1 refrigerator manufactured by Air Products Corporation. This conventional device, which is provided as an exemplary structure and is not specifically illustrated, includes a heat exchanger having a copper tip which reaches cryogenic temperatures. In the structure illustrated in FIG. 2 this copper tip is equivalent to the illustrated surface 32.

The photomixer housing 24 is mounted to the cryogenic surface 32 for cooling the photomixer element to a suitable operating range, i.e. between 70° and 140° K. The photomixer housing 24 includes a hermetically sealed housing chamber 34 within which the solid state photomixer element is mechanically mounted and electrically interconnected. The housing chamber is sealed by a top plate 36 held in place by four screws or other suitable fasteners. An optically transparent window 38 is provided at the center of the top plate 36 to permit optical radiation to fall upon the enclosed photomixer. A cylindrical radiation shield 40 is positioned around the optical window. The housing chamber 34 is secured to a conductive base plate 42 which is provided with suitable mounting apertures so that it may be secured to the cryogenic mounting surface 32.

Also secured to the base plate 42 is a microwave transmission housing 44 having a removable top panel 46. The microwave transmission housing is coupled to the housing chamber 34 by means of a short coaxial line 48 which transmits output signals from the photomixer. The microwave transmission housing 44 is similarly coupled to a coaxial cable adapter 50 which is in turn coupled by means of a coaxial cable to electronics external of the vacuum shroud, including the intermediate frequency preamplifier 18. The entire photomixer housing 24 and all of its associated components along with the intermediate frequency preamplifier 18 are designed to permit wide bandwidth transmissions so that output of the photomixer is not attenuated over the expected wide range of doppler frequency shifts mentioned above. This is in accordance with the design concept of the present invention in which the front end of the disclosed system is composed entirely of very wide bandwidth components which are designed to accommodate all frequencies within the expected 1500 MHz frequency range anticipated to result from doppler frequency shifting. The back end of the system, to be explained in more detail subsequently, contrastingly provides a narrow bandwidth, low noise network which tracks the frequency of the system front end.

Figure 3A:
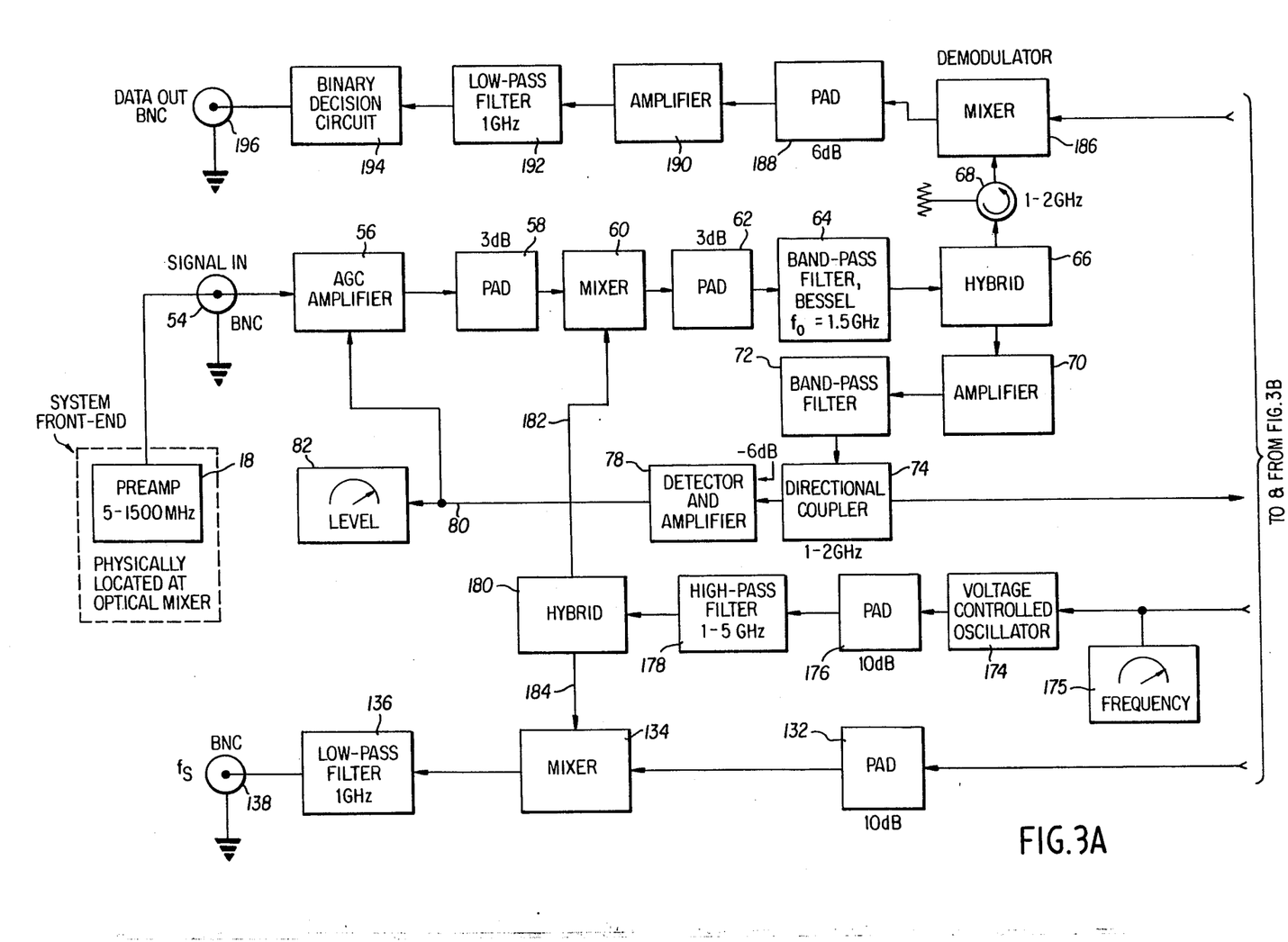
FIGS. 3A and 3B together constitute a complete block diagram of the signal tracking and demodulating network comprising the back-end of the present system; and, FIG. 4 is a block diagram illustrating a signal simulator which may be used in testing the apparatus of FIGS. 3A and 3B.
Figure 3B:
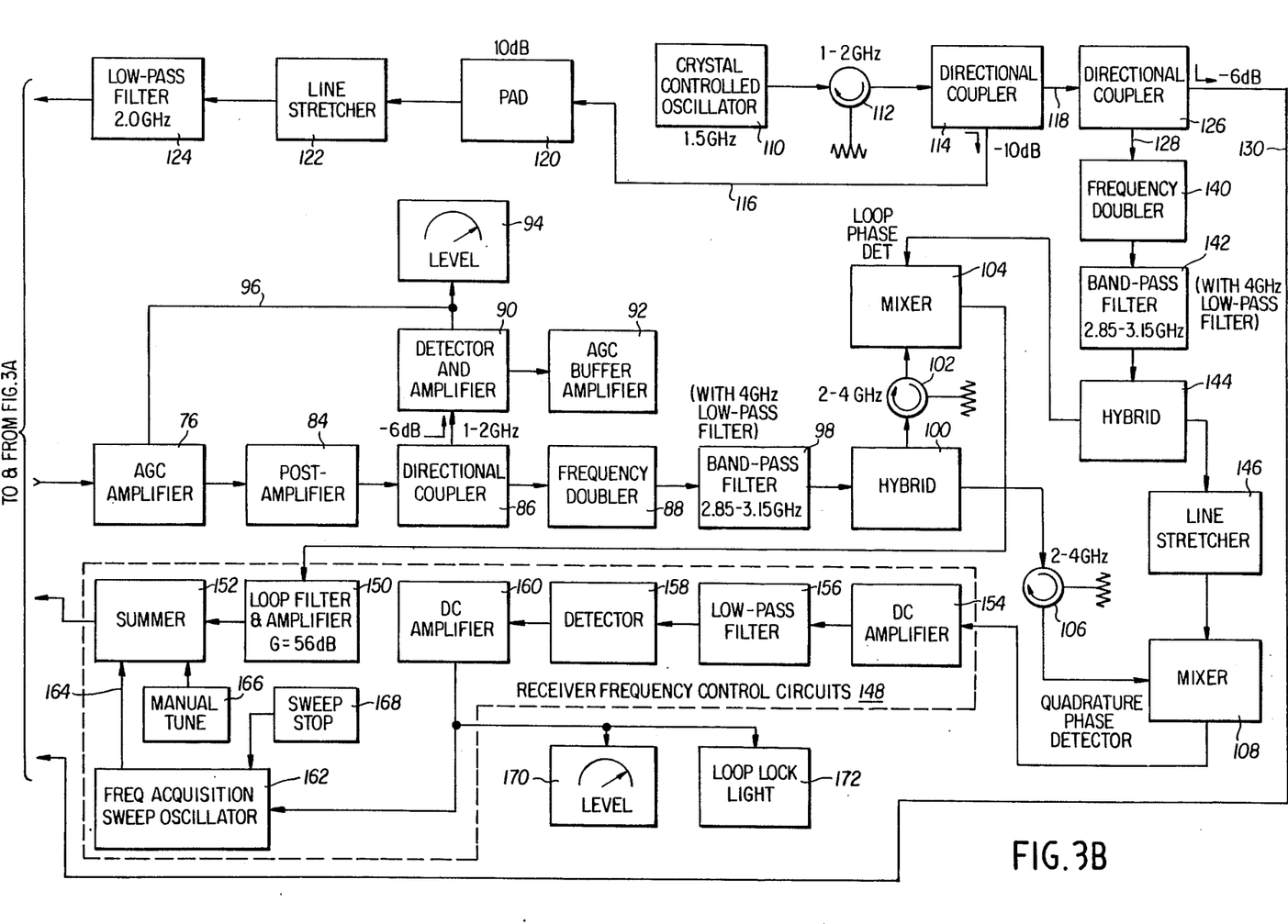

Attention is now directed to FIGS. 3A and 3B which together form a block diagram of the back end of the system of the present invention. As shown at the left of FIG. 3A, the system front end includes the preamplifier 18 which is coupled by means of a coaxial cable 52 to a signal input coupling 54 of the back-end of the system.

The receiver back-end shown in FIGS. 3A and 3B is based upon the well known squaring loop system which extracts the carrier replica from multi-phase signals by means of a squaring operation on the high frequency input signal. This type of system is particularly suitable for use in the environment of the present invention in view of its proven reliability at high receiver data rates. The complete circuit illustrated in the figures combines heterodyne demodulating circuitry with frequency tracking circuitry which follows the changing input carrier signal as it is frequency shifted by the doppler effect.

Referring again to the block diagram, the signal applied to the input plug or coupling 54 is first applied to an automatic gain control amplifier 56 preferably having a 5 - 1500 MHz bandwidth and a gain varying between −5 and +10 dB. The output of the amplifier is passed through a conventional impedance matching 3 dB pad 58 to a first mixer 60 of the heterodyne demodulating system. This first mixer is preferably a conventional doubly balanced device with a measured conversion loss of less than 5 dB.

The output of the mixer is applied through a second 3 dB pad 62 to a Bessel band pass filter 64 which is preferably a 5 pole linear phase filter having a center frequency of 1.5 GHz. The Bessel band pass filter shapes the signal spectrum during the intermediate frequency processing stage, and the binary logic levels are subsequently restored, after demodulation, using logic elements having one and zero thresholds symmetrical about the signal zero input voltage. As an alternative to this system, matched filter or synchronously controlled integration of the demodulated signal during each bit period could be used, followed by a one-zero decision based upon the integrated signal value at the end of each bit period. This technique is substantially more complicated than that used in the illustrated system, and while theoretically providing optimal signal detection, has been found to provide only a slightly better response than the illustrated system. In fact, less than 1 dB of signal degradation has been found with the use of a linear filter of the type described and illustrated. It is also notable that the data output of a squaring loop system, for either input state, has two possible equally probable phases differing by 180°. Thus binary transition coding is the most desirable data coding technique due to the fact that this coding technique is insensitive to 180° phase shifts.

The output of the band pass filter 64 is applied to a hybrid coupler 66 which performs a power dividing function, supplying a portion of the input signal through a circulator 68 to a demodulating network, and supplying a second portion of the input signal to the frequency tracking portion of the system. More particularly, this second portion of the signal is fed through a conventional amplifier 70 to a band pass filter 72. The amplifier 70 is preferably characterized by a passband from 1 to 2 GHz and a gain of 17 dB. The band pass filter 72 preferably has a pass band of 1.35 to 1.65 GHz with a center frequency of 1.5 GHz and a 3 dB band width of 314 MHz. The band pass filter also has a rejection greater than 40 dB for frequencies above 1700 MHz and below 1300 MHz. The output of the band pass filter is applied to a directional coupler 74 having a 1 to 2 GHz passband. The directional coupler divides the signal emanating from the band pass filter 72 into two components, one of which remains in the frequency tracking signal processing loop and is applied to an automatic gain control amplifier 76, and the other of which is applied to a detector and amplifier 78 which supplies a feedback signal over a line 80 to the amplifier 56 for regulating the gain thereof. A meter 82 is also connected to the line 80 for monitoring the level of a gain control signal applied to amplifier 56. The function of the feedback loop regulating the gain of amplifier 56 is to provide approximately 15 dB of control prior to the application of the input signal to the first mixer 60. This gain control function serves to maintain the signal level into the data demodulator circuitry at a near constant level.

The other output from the direct coupler 74 is passed through automatic gain control device 76, as mentioned above, which preferably has a gain varying between 0 and 30 dB. The output of device 76 is applied to a post amplifier 84 characterized by a nominal gain of 30 dB for frequencies between 1 and 2 GHz and a 1 dB gain compression at +30 dBm output power. The output of the post amplifier 84 is applied to a directional coupler 86 where it is divided between a frequency doubler 88 and an automatic gain control loop including a detector and amplifier 90, an automatic gain control buffer amplifier 92 and a gain level meter 94. A line 96 couples the output of the detector and amplifier 90 to the automatic gain control device 76 for regulating the gain thereof, while the gain level meter 94 monitors the output signal on line 96 to indicate the gain level of the device 76. This second gain control loop perferably has more than 30 dB of control and is located in the IF path of the frequency tracking loop. Its purpose is to maintain the power level constant at the input of the frequency doubler 88 so that the tracking loop gain will not vary as a function of input signal level.

The output of frequency doubler 88 is applied to a band pass filter 98 having a pass band extending from 2.85 to 3.15 GHz, i.e. 300 MHz. The filter is preferably characterized by a rejection of at least 68 dB at 1.5 GHz and 59 dB at 4.5 GHz and may also include a 4 GHz low pass filter for removing higher frequency components from the passed signal. The passed signal is applied to a hybrid coupler having a 2 to 4 GHz passband which provides a power dividing function. More particularly, one portion of the signal supplied through the band pass filter 98 is fed through a first circulator 102 to a second mixer 104 serving as a loop phase detector. The other portion of the signal applied to the hybird coupler 100 is fed through a second circulator 106, which is preferably identical to the circulator 102, to a third mixer 108 which operates as a quadrature phase detector. Both of the mixers 104 and 108 are preferably doubly balanced devices with IF port responses extending down to DC levels and conversion losses and DC offsets optimized for 3.0 GHz local oscillator and RF inputs. As will be explained in more detail subsequently, the loop phase detector mixer 104 acts in conjunction with other system components to vary the frequency of the LO to the first mixer 60 to provide the previously described frequency tracking function of the disclosed receiver system. Similarly, the quadrature phase detector mixer 108 acts in conjunction with other system components to control frequency acquisition components which search out and lock on to the incoming information signal.

The intermediate or heterodyning frequency of the system is provided by an oscillator 110 which is preferably a 1.5 GHz oscillator phase locked to an internal crystal controlled source and having an output power level of approxmiately +24 dBm. The output of this oscillator is passed through a 1 to 2 GHz circulator 112 to a first directional coupler 114 which divides the oscillator power between two output lines 116 and 118. The signal delivered to the line 116 is reduced in magnitude by approximately 10 dB and is fed through a 10 dB pad 120, a line stretcher 122 and a 2.0 GHz low pass filter 124 to the demodulating circuitry of the receiver, which will be described in detail subsequently. The other output of directional coupler 114 is carried over line 118 to a second directional coupler 126 having a 1.5 to 3 GHz band width. The second directional coupler further divides the output power of the oscillator 110 into primary and secondary signal paths identified by output lines 128 and 130, respectively. The secondary signal path along output line 130 carries a signal reduced in magnitude by approximately 6 dB which is fed through a 10 dB pad 132 to a fourth mixer 134 which is included to derive the receiver input carrier frequency for monitoring and testing purposes. The output of the mixer 134 is coupled through a 1 GHz low pass filter 136 to a suitable output coupler 138.

The primary output of the directional coupler 126 is applied over the line 128 to a second frequency doubler 140, the output of which is in turn passed through a band pass filter 142 to a hybird coupler 144 serving as a power divider. The band pass filter 142 is preferably identical to the band pass filter 98 described previously, and preferably also includes a 4 GHz low pass filter for attenuating undesired higher frequency components. One of the outputs of the hybrid coupler 144 is connected to the loop phase detector mixer 104, while the other output of the hybird coupler is connected through a line stretcher 146 to the quadrature phase detector mixer 108. In both instances, the outputs of the hybird coupler 144 provide the heterodyning intermediate frequency inputs to the two mixers.

As mentioned previously, the outputs of both mixers 104 and 108 are applied to the receiver frequency control circuits 148, although the outputs of both mixers serve different functions. More particularly, the output of mixer 104 is coupled to a combined loop filter and amplifier 150 perferably having a gain of 56 dB, and coupled at its output to a summing circuit 152. Similarly, the output of mixer 108 is coupled through a DC amplifier 154, a low pass filter 156, a detector 158 and a second DC amplifier 160 to a frequency acquisition sweep oscillator 162. The output of the frequency acquisition sweep oscillator is coupled over a line 164 to the summer 152, which also includes a manual tuning input 166. The frequency acquisition sweep oscillator also includes a sweep stop input 168 and has a DC level meter 170 and a loop lock indicator light 172 coupled to its input for monitoring the performance of the frequency acquisition system.

The output of summer 152 is coupled to a voltage controlled oscillator preferably having a tuning range between 1.5 and 3.0 GHz with a nominal output power of 23 dBm. This oscillator is connected through a 10 dB pad 176 and a 1.5 GHz high pass filter 178 to a hybird coupler 180 which divides the input signal and supplies a primary output over line 182 to the first mixer 60 and a secondary output over line 184 to the forth mixer 134.

Frequency acquisition, that is the locking of the tracking loop onto the incoming information signal, may be accomplished through both manual and automatic operations in the illustrated system. It will be understood, of course, that manual tuning of the system when adapted for use in outer space would be accomplished prior to launching of the system or by telemetry controlled assist. Normally, a manual tuning signal is applied to the summer 152, which in turn places the output frequency of the voltage controlled oscillator 174 in the vicinity of the anticipated input information signal frequency. The frequency acquisition sweep oscillator then provides a triangular type automatic frequency sweep of about 170 MHz each 120 milliseconds, causing appropriate adjustments in the output of the voltage controlled oscillator. Eventually the voltage control oscillator places the IF signal within the acquisition range of the tracking loop, at which time the frequency acquisition sweep oscillator is stopped by a signal from the sweep component 168. In accordance with this technique, the frequency tracking loop will lock on to the input frequency within 120 milliseconds provided the voltage controlled oscillator is initially preset to a frequency within 85 MHz of its proper value. The frequency tracking loop thus modifies the intermediate or heterodyning frequency applied to the first mixer 60 in accordance with changes in the input frequency so that changes in the frequency of the received data signal, whether due to doppler shift or other causes, are tracked accurately by the system. It is also noted that a frequency indicating meter 175 is coupled to the output of the summer 152 to monitor the output thereof.

As mentioned previously, the input signal is initially divided by hybrid coupler 66 into a first portion which, as was described above, is fed to the frequency tracking loop to modify the intermediate frequency and thus track the varying frequency of the input signal. The other component of the input signal is fed from the hybrid coupler 66 through a circulator 63 to a fifth mixer 186 acting as a data demodulator. This mixer is also a doubly balanced device with a 1 to 2 GHz passband for RF signals and an IF bandwidth between 0 and 600 MHz. The demodulator mixer 186 receives its information signal input component from the hybird coupler 66 and its intermediate or heterodyning frequency component from crystal oscillator 110 through low pass filter 124. The output of the mixer 186 is fed through a 6 dB pad 188 to an output amplifier 190 which amplifies the demodulated signal. The amplifier 190 is preferably characterized by a nominal gain of 40 dB over a bandwidth of from 0.1 to 400 MHz. The output of the amplifier 190 is passed through a 1 GHz low pass filter 192 to a binary decision circuit which may be a conventional integrated circuit comparator type of binary device. Specifically, the binary decision circuit may include a conventional MC 1692 line receiver that contains four differential input logic elements and a voltage reference which is at the logic transistion voltage. Clearly, other types of binary decision circuits are also usable in the context of the present invention. The output of the decision circuit 194 is applied to an output coupler 196 for delivery to appropriate output processing circuitry.

It will be apparent to those skilled in the art that all of the elements or individual circuits represented in the functional block diagram of FIGS. 3A and 3B are conventional, commercially available components or circuits commonly used in high frequency communication systems. Thus none of the elements of the block diagram are considered to be in any novel or are intended to constitute any portion of the present invention. The present invention is in the system defined by the combination of elements illustrated in the figures, as well as in various subcombinations of that system.

Figure 4:
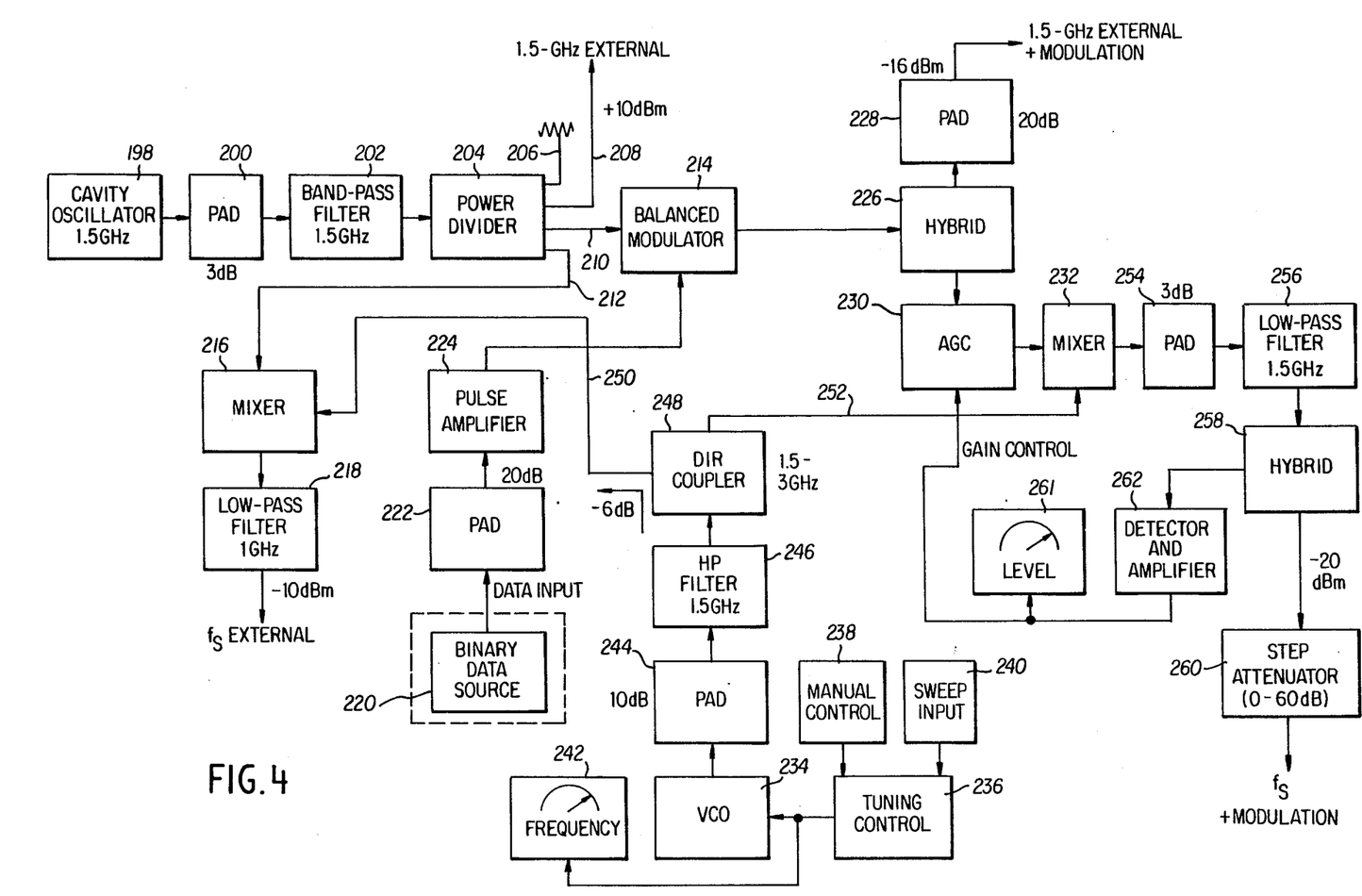

Attention is now directed to FIG. 4 which illustrates a signal simulator intended to be used as a signal source in testing the performance of the wide band doppler tracking receiver back end illustrated in FIGS. 3A and 3B. The signal simulator illustrated in FIG. 4 is designed to have a carrier frequency variable between 200 and 900 MHz which is phase-shift-key modulated at a data rate of 300 megabits per second and with a power level adjustable between −20 and −80 dBm. In the illustrated circuit, tuning of the signal source is accomplished by both manual control and by an external control voltage which is applied at the illustrated sweep input port. Referring particularly to FIG. 4, the illustrated signal simulator includes a 1.5 GHz cavity oscillator 198 having an output power of approximately +20 dBm. The output of the oscillator is passed through a 3 dB pad 200 to a band pass filter 202 having a center frequency of 1.5 GHz. The band pass filter is in turn coupled to a four terminal power divider 204, one terminal 206 of which is simply terminated, while a second output terminal 208 is provided as a source of 1.5 GHz signals for external uses. The remaining two terminal 210 and 212 of the power divider are respectively coupled to a balanced modulator 214 and a mixer 216. The balanced modulator is simply a 1 to 2 GHz doubly balanced mixer, while the mixer 216 is simply a conventional mixer which is coupled through a 1 GHz low pass filter to an output coupling for providing the selected output carrier frequency to external test or monitoring apparatus.

A suitable binary data source 220 is coupled through a 20 dB pad 222 and a pulse amplifier 224 to the balance modulator 214 to provide a digital information input. The modulated output of the balance modulator 214 is applied to a power dividing hybrid coupler 226 which supplies one portion of the incoming signal through a 20 dB pad 228 to an external signal coupling for providing ready access to the modulated 1.5 GHz signal. The other output of the hybrid coupler 226 is fed to an automatic gain control amplifier 230 which acts as an absorptive modulator to level the modulated signal output.

The output of the automatic gain control amplifier is applied to a mixer 232, which is preferably a wide band unit which converts the modulated 1.5 GHz signal to the desired 200 to 900 MHz modulated output. The heterodyning or intermediate frequency applied to the mixer is generated by a voltage controlled oscillator 234 which is tunable between 1.5 and 3.0 GHz and preferably has a nominal power output of 17 dBm and a tuning sensitivity of 50 MHz per volt. The oscillator 234 is set via a tuning control 236 which is essentially a voltage source variable by both a manual control 238 and a sweep input 240. The tuning control of the tuning control 236 is monitored by a frequency calibrated meter 242 for providing an indication of the frequency of the oscillator 234. The output of the oscillator 234 is fed through a 10 dB pad 244 and a 1.5 GHz high pass filter 246 to a power dividing direct coupler 248. The directional coupler applies a first portion of the input signal reduced 6 dB over a line 250 to the mixer 216, and the remainder of the signal over a line 252 to the mixer 232.

The output of the mixer 232 is fed through a 3 dB pad 254 to a 1.5 GHz low pass filter 256 and from there to a hybrid coupler 258 which divides the signal power between a gain control loop and a step attenuator 260 from which the desired output test signal is supplied. The automatic gain control loop includes a detector and amplifier 262 and a voltage level meter 264 for monitoring the gain of amplifier 230. The step attenuator 260 provides a selectable attenuation up to 60 dB for the output signal and 10 dB steps.

Again, it will be apparent to those skilled in the art that all of the elements identified in block diagram form in figure form are conventional or well known elements. Thus the elements identified by the block diagram are not individually considered to comprise any aspect of the present invention, and are each considered to be conventional or well known. The present invention resides in the combination of elements forming the illustrated system, and in various subcombinations thereof.

The output of the signal simulator illustrated in FIG. 4, specifically the output of the step attenuator 260, can be coupled to the input coupling 54 of the receiver back end illustrated in FIGS. 3A and 3B to test the performance of the receiver and to check its ability to track time varying input frequencies. The signal simulator may be connected to the input coupling 54 by means of a switching system together with the receiver front end previously described so that the operating performance of the receiver back end can be tested from time to time simply by switching in the signal simulator. This arrangement can be used either in laboratory testing of the receiver or under actual operating conditions provided a remote control switching network is used.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A wideband receiver for a laser communication system, comprising:
   wideband optical transducer means for detecting modulated optical signals over a predetermined range of carrier frequencies and for converting said optical signals to electrical signals;
   wideband preamplifier means coupled to said optical transducer means for amplifying the output thereof; and
   narrow band signal processing and demodulating means coupled to said preamplifier means for processing and demodulating said electrical signals including;
   heterodyne demodulating means for demodulating said electrical signals,
   frequency tracking means coupled to said heterodyne demodulating means for adjusting said heterodyne demodulating means in accordance with changes in said carrier frequency of said detected signal,
   first mixer means coupled to said preamplifier means for mixing a variable intermediate frequency with the output of said preamplifier means,
   frequency tracking feedback loop means coupled to said first mixer means for varying said intermediate frequency in response to changes in said carrier frequency of said detected signals, linear band pass filter means coupled to said first mixer means for filtering the output thereof, and wherein said heterodyne demodulating means includes fourth mixer means coupled to said linear band pass filter means for demodulating the output thereof and binary decision circuit means coupled to said fourth mixer means for supplying binary logic levels to the output thereof.

2. A system as in claim 1, wherein said wideband optical transducer means comprises:

solid state photomixer means for converting optical energy to electrical energy, housing means having an optical window for enclosing said photomixer means, said housing means including electrical coupling means for coupling output signals of said photomixer to said preamplifier means; and, cooling means coupled to said housing means for maintaining the temperature of said photomixer means within a predetermined temperature range.

3. A system as in claim 2, wherein:

said photomixer means comprises a photovoltaic Hg Cd Te infrared mixer element having a bandwidth of at last 1500 MHz.

4. A system as in claim 3, wherein:

said cooling means includes means for reaching cryogenic temperatures; and said predetermined temperature range extends from 70° to 140° K.

5. A system as in claim 1, wherein said frequency tracking feedback loop means further comprises:

frequency doubling means coupled to said first mixer means for doubling the frequency of an output signal thereof, intermediate frequency oscillator means for generating a stable intermediate frequency signal, second mixer means coupled to said frequency doubling means and to said intermediate oscillator means for producing a variable intermedite frequency signal; and, coupling circuit means coupled between said second mixer means and said first mixer means for supplying said first mixer means for supplying said variable intermediate frequency signal to said first mixer means.

6. A system as in claim 5, further comprising:

frequency acquisition means coupled to said coupling circuit means for sweeping said variable intermediate frequency signal to enable said frequency tracking feedback loop means to lock onto said detected signal.

7. A system as in claim 6, wherein said frequency acquisition means further comprises:

third mixer means coupled to said frequency doubling means and to said intermediate frequency oscillator means for providing a quadrature phase detector, sweep oscillator means coupled to said third mixer means for sweeping said variable intermediate frequency across a selected frequency range.

8. A system as in claim 7, wherein:

said coupling circuit means includes a voltage controlled oscillator; and, said sweep oscillator means and said second mixer means are coupled to the input of said voltage controlled oscillator.

9. A system as in claim 5, wherein said intermediate frequency oscillator means includes;

stabilizing oscillator means for producing a stable output signal; and, second frequency doubling means coupled to said stabilized oscillator for doubling said stable output signal.

* * * * *